(12) United States Patent
Forman

(10) Patent No.: US 11,569,839 B1
(45) Date of Patent: Jan. 31, 2023

(54) METHOD AND APPARATUS FOR ENHANCING DYNAMIC RANGE IN A DIGITAL-TO-ANALOG CONVERSION CIRCUIT

(71) Applicant: ESS Technology, Inc., San Jose, CA (US)

(72) Inventor: Dustin Dale Forman, Kelowna (CA)

(73) Assignee: ESS Technology, Inc., San Jose, CA (US)

( * ) Notice: Subject to any disclaimer, the term of this patent is extended or adjusted under 35 U.S.C. 154(b) by 0 days.

(21) Appl. No.: 17/525,407

(22) Filed: Nov. 12, 2021

(51) Int. Cl.
| | |
|---|---|
| H03M 1/70 | (2006.01) |
| H03M 1/18 | (2006.01) |
| H03G 7/00 | (2006.01) |
| H03M 1/66 | (2006.01) |

(52) U.S. Cl.
CPC .............. H03M 1/70 (2013.01); H03G 7/007 (2013.01); H03M 1/18 (2013.01); H03M 1/661 (2013.01)

(58) Field of Classification Search
CPC ........... H03M 1/661; H03M 1/70; H03M 1/18
See application file for complete search history.

(56) References Cited

U.S. PATENT DOCUMENTS

| | | | | |
|---|---|---|---|---|
| 5,757,298 A * | 5/1998 | Manley | ..................... | G09G 5/02 341/138 |
| 6,150,970 A * | 11/2000 | Anagnos | ............. | H03M 1/0682 341/110 |
| 6,304,241 B1 * | 10/2001 | Udo | ...................... | G09G 3/3688 345/98 |
| 6,384,763 B1 * | 5/2002 | Leung | .................. | H03M 1/0602 341/154 |
| 6,400,300 B1 * | 6/2002 | Leung | .................. | H03M 1/0678 341/154 |
| 6,433,717 B1 * | 8/2002 | Leung | .................. | H03M 1/0663 341/154 |
| 7,058,369 B1 * | 6/2006 | Wright | .................. | H03F 1/3294 455/114.2 |
| 9,571,077 B1 * | 2/2017 | Iorga | ...................... | H03K 5/131 |
| 10,090,854 B1 * | 10/2018 | Clara | ...................... | H03M 1/70 |
| 10,693,483 B1 * | 6/2020 | Luo | ...................... | H03M 1/0836 |

(Continued)

OTHER PUBLICATIONS

Jerry C. Whitaker, Editor-in-Chief, "The Electronics Handbook Second Edition," 2005, Title Page, Copyright Page, and pp. 1368-1382, CRC Press, Taylor & Francis Group, Boca Raton, FL 33487-2742.

*Primary Examiner* — Lam T Mai
(74) *Attorney, Agent, or Firm* — Gard & Kaslow LLP

(57) ABSTRACT

Described herein is a method and apparatus for enhancing the dynamic range of a digital-to-analog conversion circuit. Dynamic range enhancement (DRE) is accomplished by modifying the gain of components of the circuit so that the gain of components generating noise is effectively reduced. In a circuit utilizing a plurality of 1-bit DACs, analog signal gain is decreased when the full nominal gain of the analog portion of the circuit is not needed to obtain a desired peak output amplitude. The reduction is accomplished by effectively "disconnecting" some of the plurality of 1-bit DACs. Some or all of the 1-bit DACs are configured to have a third or "tri-state" in which there is no connection to the normal two reference levels thus providing no output. If some portion of the 1-bit DACs is placed in the tri-state, both the signal and noise gain will be reduced.

12 Claims, 4 Drawing Sheets

(56) References Cited

U.S. PATENT DOCUMENTS

| | | | | |
|---|---|---|---|---|
| 2002/0105449 | A1* | 8/2002 | Schreier | H03M 3/482 |
| | | | | 341/139 |
| 2005/0146454 | A1* | 7/2005 | Wang | H03H 17/0261 |
| | | | | 341/144 |
| 2006/0176203 | A1* | 8/2006 | Grosso | H03M 1/70 |
| | | | | 341/144 |
| 2007/0103357 | A1* | 5/2007 | Alfano | G06F 15/7814 |
| | | | | 341/155 |
| 2012/0182165 | A1* | 7/2012 | Currivan | H04B 1/10 |
| | | | | 341/107 |
| 2012/0249348 | A1* | 10/2012 | Siragusa | H03M 1/1009 |
| | | | | 341/110 |
| 2013/0135127 | A1* | 5/2013 | Siragusa | H03M 1/1033 |
| | | | | 341/110 |
| 2020/0343304 | A1* | 10/2020 | Ge | G11C 13/0033 |
| 2022/0045692 | A1* | 2/2022 | Birdsong | H03M 3/412 |

* cited by examiner

METHOD AND APPARATUS FOR ENHANCING DYNAMIC RANGE IN A DIGITAL-TO-ANALOG CONVERSION CIRCUIT

FIELD OF THE INVENTION

The present invention relates generally to circuits performing digital-to-analog conversion, and more particularly to a method and apparatus for providing enhancement of the dynamic range of such circuits.

BACKGROUND OF THE INVENTION

In many current applications digital data is stored that represents analog signals, such as audio or video signals. Digital-to-analog converters (DACs) are used to convert the digital data into analog signals that can be observed or sensed by a user. (In many cases, the digital data is obtained by converting an analog signal into digital bits for storage, using analog-to-digital converters (ADCs).)

For example, many music players convert digital data streams into analog audio signals that can drive speakers or headphones so that a user can hear sound, while video players convert digital data into analog video signals that can be viewed by the user on a display screen (often with an audio component as well). DACs are thus widely used today.

Noise, which is defined as any signal other than the one desired or being reproduced or monitored, occurs in all electronic circuits. It is generally desirable to minimize the noise in a circuit; in the case of a digital-to-analog conversion, this is desirable as noise causes the analog signal being produced (or reproduced) to contain errors, i.e., to deviate from the desired analog signal represented by the digital bits alone.

The dynamic range of a circuit is a measurement of the difference between the largest and smallest signals the circuit can reliably reproduce expressed in decibels. This is usually related to the noise floor of the circuit, the measure of the noise signal created from the sum of all the noise sources and unwanted signals within the circuit.

In the application of digital-to-analog conversion, a DAC is usually followed with an analog circuit that includes filtering and gain of the now-analog signal. It is desirable to have a large enough signal gain to get the peak output amplitude desired, but that signal gain also comes with a correlated noise gain. However, in some cases the full potential gain of the circuit is not needed. For example, a user may turn down the volume of an audio signal. Similarly, a user might turn down the "brightness" of a pixel that is driven by a circuit with a DAC used for video. One of skill in the art will be aware of other analog signals that may be "turned down" in similar fashion. In such instances, the circuit still has a large active gain and resulting noise gain, which limits the noise floor that the circuit can achieve.

If the analog signal gain could be decreased when more headroom is not required, such as at a lower volume or brightness, this would limit the noise gain in a circuit including a DAC and would increase the dynamic range of the circuit.

SUMMARY OF THE INVENTION

Described herein an apparatus and method for enhancing the dynamic range of a digital-to-analog converter.

One embodiment describes an apparatus comprising: a first plurality of digital-to-analog converters (DACs), each DAC in the first plurality of DACs configured to receive a digital signal and to produce outputs at two reference levels; a second plurality of DACs, each DAC in the second plurality of DACs configured to receive the digital signal and to have two states to produce outputs at two reference levels and a third state to produce no output; an analog following circuit configured to receive outputs from the first and second plurality of DACs and to amplify and filter the outputs from the first and second plurality of DACs thereby producing an analog signal; a controller configured to determine that the amplitude of the analog signal does not require outputs from all of the first and second plurality of DACs and to generate a control signal to the second plurality of DACs to enter the third state to produce no outputs.

Another embodiment describes an apparatus comprising: a first plurality of digital-to-analog converters (DACs), each DAC in the first plurality of DACs configured to receive a digital signal and to produce outputs at two reference levels; a second plurality of DACs, each DAC in the second plurality of DACs configured to receive the digital signal and to have two states to produce outputs at two reference levels; an analog following circuit configured to receive outputs from the first and second plurality of DACs and to amplify and filter the outputs from the first and second plurality of DACs thereby producing an analog signal; a plurality of switches, each switch coupled to a different one of the second plurality of DACs and having two positions, a first position which passes the output of the DAC to which it is coupled to the analog following circuit and a second position which prevents the output of the DAC to which it is connected from being passed to the analog following circuit; and a controller configured to determine that the amplitude of the analog signal does not require outputs from all of the first and second plurality of DACs and to generate a control signal to the plurality of switches to place the switches in the second position so that no outputs from the second plurality of DACs are passed to the analog following circuit.

Still another embodiment describes a method of generating an analog signal from a digital-to-analog circuit comprising first and second pluralities of digital-to-analog converters (DACs), each DAC in the first plurality of DACs configured to receive a digital signal and to produce outputs at two reference levels, and each DAC in the second plurality configured to receive the digital signal and to have two states to produce outputs at two reference levels and a third state to produce no output, and an analog following circuit configured to receive outputs from the first and second plurality of DACs and to amplify and filter the outputs from the first and second plurality of DACs, the method comprising: receiving, by the pluralities of DACs, the digital signal; determining, by a controller, when the analog signal does not require outputs from all of the DACs; when the analog signal does not require outputs from all of the DACs, generating, by the controller, a control signal to the second plurality of DACs to enter the third state and produce no outputs and increasing gain of the digital signal before receipt of the digital signal by the first and second plurality of DACs; and amplifying and filtering the outputs from the DACs to generate the analog signal.

DETAILED DESCRIPTION OF THE INVENTION

Figure 1:
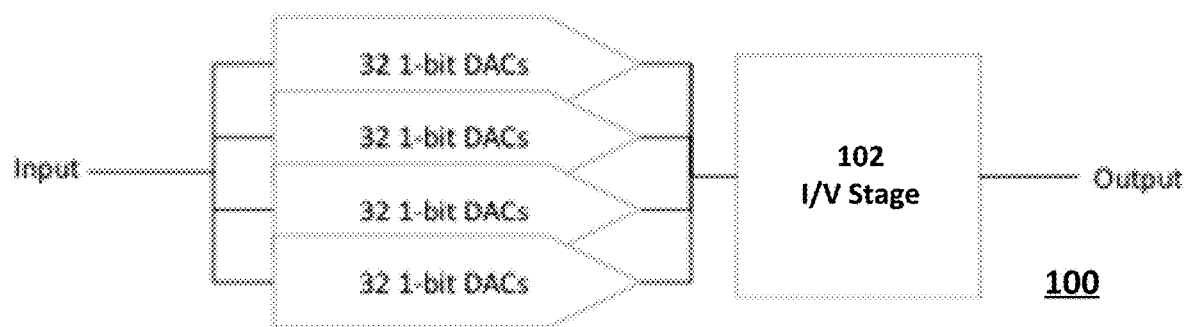
FIG. 1 is a block diagram of an array of 1-bit DACs as known in the prior art.

Described herein is an apparatus and method for enhancing the dynamic range of a digital-to-analog conversion circuit.

Under the present approach, dynamic range enhancement (DRE) is accomplished by modifying the gain of components of the circuit so that the gain of components generating noise is effectively reduced. In a circuit utilizing a plurality of 1-bit DACs, as above a large enough analog signal gain to get the desired peak output amplitude is applied after the digital-to-analog conversion. However, when, for example, the user turns down the volume in an audio application, rather than leave the analog signal gain at its normal level as above, the analog gain is turned down as the headroom from the larger gain is not required. This reduces the gain applied to the noise as well, and the dynamic range of the circuit is increased. (In a video application, increasing the dynamic range helps make "blacker" blacks and improves the contrast ratio.)

The reduction is accomplished by effectively "disconnecting" some of the plurality of 1-bit DACs so that the overall output impedance of the DACs is increased and the analog gain, and the noise gain, is reduced. Some or all of the 1-bit DACs are configured to have a position in addition to those in which they connect to either the GND or VCC reference levels, i.e., a third or "tri-state" in which there is no connection to either reference level. If some portion of the 1-bit DACs is placed in the tri-state, both the signal and noise gain will be reduced. Alternatively, in some embodiments rather than using a number of DACs having a tri-state, switches could be placed at the outputs of the same number of individual DACs so that in one position each switch prevents the output of a DAC from being combined with the outputs of the other, active DACs.

Digital to analog (D/A) conversion can be done in several ways. One approach is to use a voltage mode digital-to-analog Converter (DAC) that effectively drives an output between two voltage references. The two references represent the range the DAC output can span. Typically, one reference is a ground (herein "GND"); the output signal is usually measured relative to ground, and thus ground is considered to be inherently noiseless.

The other reference is typically at some voltage above ground (herein "VCC") that is determined by the silicon process the DAC is built on. For example, some voltage mode DACs commonly available use anywhere from 1.2 volts (V) to 4.5 V for this second reference. This reference should be designed to have low noise in the band of interest, which in the case of DACs is commonly the audio band of approximately 20 hertz (Hz) to 20 kilohertz (kHz; 20 kHz is 20,000 Hz).

At its basic level, a DAC is a fixed impedance element, such as a resistor, capacitor or inductor, connected to a switch that can connect to either reference value, i.e., either to GND or to VCC. In the simplest configuration, there can be a single instance of the switch and resistor arrangement connected to GND and VCC; this is known as a voltage-mode 1-bit DAC. (One of skill in the art will appreciate that in some cases the switch itself may function as both the switch and the impedance element, without the need for a separate resistor, capacitor or inductor.)

While the embodiments herein are described with reference to 1-bit DACs, one of skill in the art will appreciate that the present approach may similarly be applied to multi-bit DACs, since a multi-bit DAC may be made by simply summing a plurality of 1-bit DACs, or by providing more voltage references to which the impedance element may connect.

Connecting multiple 1-bit DACs in parallel can make a higher resolution DAC. For example, one can take two such 1-bit DACs and connect the output of the resistor together. Now there are four possible states; both DACs can have their switches set to GND, both DACs can have their switches set to VCC, a first DAC can be at GND and the second at VCC, and finally, the first DAC can be at VCC and the second DAC at GND. Note that the output of the last two states is the same, i.e. one DAC is at VCC and the other is at GND; the output is the same regardless of which DAC is at each level as the total output is the same. Thus, while there are four possible states, there are only three possible output values.

It will be seen that for any number N of 1-bit DACs wired in parallel, the number of discrete output levels is N+1. This concept of using parallel 1-bit DACs can be extended to any number, although in practice a number around 64 is commonly used, resulting in 65 discrete output levels. (As known in the art, when the digital signal can span all of the digital values that can be created by all of the DACs contributing to the output the circuit is said to be operating at 0 decibels relative to full scale, or dBFS; the digital signal is translated to an analog voltage based upon the reference voltages, and thus a full scale analog signal spans the available voltage range.) It will be seen that the DAC array output impedance is equal to the 1-bit DAC output impedance ($R_{dac}$), which is the resistor plus the $R_{on}$ (switch-on resistance) of the switch used, divided by the number of DACs in parallel, calculated in the same way that one would calculate the impedance of N parallel resistors.

The array of 1-bit DACs takes the digital binary signal, a string of ones and zeros, and changes it to a pulse train that contains an average of the change in the amount of energy represented in the sample, but also typically contains quantization noise due to the differences, or errors, between the actual analog signal originally converted to a digital signal and the output digital signal levels available.

Various modulation techniques exist to drive such a parallel array of 1-bit DACs so that this quantization noise can be placed in a portion of the frequency band that is not of interest in the analog signal where it can be filtered out. Delta-sigma modulation is a well-known technique that is commonly used to move the quantization noise of the, for example, 65 discrete levels of a 64 1-bit DAC array to a typically higher frequency band than that of interest, so that low-pass filtering can remove the noise, commonly called "out of band" (OOB) noise.

This low-pass filtering is commonly done with an external active circuit, sometimes called an "I/V" stage that converts the current from a DAC into an analog voltage and performs the described filtering of the signal. The gain of this active circuit is determined by the ratio of a feedback resistance $R_{fb}$ to the DAC array output impedance $R_{dac}$, such that the gain is $R_{fb}/R_{dac}$. It may thus be seen that the number of parallel 1-bit DACs determines the gain, since as above the DAC array output impedance is given by $R_{dac}$, the impedance of a single 1-bit DAC, divided by the number of DACs in parallel.

The switch in a 1-bit DAC can be modulated between GND and VCC using various techniques; one such technique is pulse width modulation (PWM), and another technique is pulse density modulation (PDM).

In PWM, pulses occur at constant intervals, i.e., at a constant frequency, but the "duty cycle," i.e., the width of each pulse, varies. Using some type of analog averaging on the output of the 1-bit DAC, a useful digital to analog conversion can be realized. It will be apparent that to create an output at the GND voltage, the switch can simply be held to the GND supply. Similarly, to create a VCC output level, the switch can be set to the VCC supply.

On the other hand, to get the average of the two reference voltages, i.e., one-half of VCC, the switch may be set to VCC for half of an interval and to GND for the other half. Similarly, to get a value of three quarters of VCC, it can be seen that setting the switch to VCC for three-quarters of the PWM period and GND for one quarter of the period would achieve this.

By contrast, PDM is a technique where the period of switching between the two references is not restricted to be fixed, but the "long term" average of the time the switch is at the VCC reference versus the time the switch is at the GND reference is determined by the desired output level. For example, to create a value of one-half VCC, the switch can be connected to VCC for one unit of time, and to GND for one unit of time. Similarly, to create a value of three-quarters VCC, the switch can be connected to VCC for three units of time, and to GND for one unit of time.

As above, it is desirable to have a large enough signal gain in the analog circuit filtering circuit that follows the array of DACs to get the peak output amplitude desired, but that signal gain also increases the amount of correlated noise. Again, if a user turns down the volume of an audio signal, for example, the circuit still has a large active gain and resulting noise gain, which limits the noise floor that the circuit can achieve. If the analog signal gain could be decreased when more headroom is not required, such as at a lower volume, this would limit the noise gain in a circuit including a DAC and would increase the dynamic range of the circuit. Such modifying of the gain of the noise sources in an analog circuit is known as dynamic range enhancement (DRE).

By changing the number of the parallel 1-bit DACs that are active in a voltage mode DAC array with an active following analog circuit, a circuit with DRE can be created. As above, the gain of the following analog circuit has its gain determined by the DAC array output impedance $R_{dac}$, and changing the number of active parallel 1-bit DACs changes the value of $R_{dac}$.

Under the present approach, the 1-bit DACs have a third state, the two states described above, i.e., switching the resistor to VCC or to GND, and an additional "tri-state" in which there is no connection from the resistor to either reference. Alternatively, as above the output of a 1-bit DAC can be connected to a switch so that in one position the switch prevents the output of the DAC from being combined with the outputs of the other, active DACs. Both a third state and a switch disconnecting the output of a DAC result in a reduction of the number of DACs contributing to the output and thus the overall value of $R_{dac}$, and each technique is therefore to be considered within the definition of a "tri-state" as that term is used herein.

By dynamically placing some number of the N parallel 1-bit DACs in the tri-state, both the signal and noise gain will change. The array of DACs is coupled with circuitry to detect when the desired output signal level is small enough that less analog gain is needed. In this case, the "nominal" analog gain that occurs when the circuit is operating full scale, i.e., when all DACs are connected to either GND or VCC, can be decreased, and the digital gain increased to compensate, so that the overall signal gain from digital signal to analog signal remains constant, however, since the noise gain is a function of only the analog gain, the noise in the analog signal goes down. This increases the dynamic range of the circuit.

Figure 2:
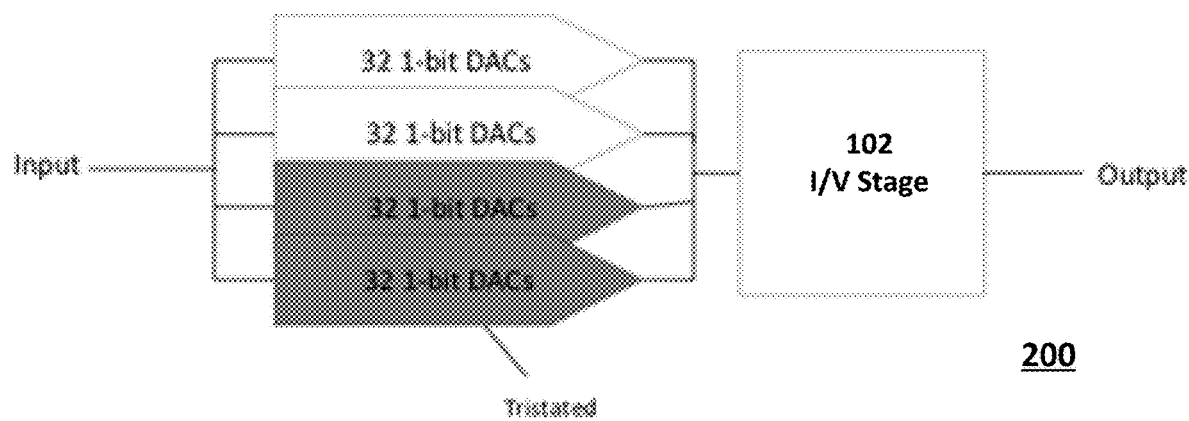
FIG. 2 is a diagram of an array of 1-bit DACs according to one embodiment of the present approach.

FIGS. 1 and 2 illustrate, in one example, the difference between the prior art and the present approach. FIG. 1 is a block diagram of circuit 100 containing an array of 128 1-bit DACs as known in the prior art. The 128 DACs are shown as four groups of 32 DACs each. All of the outputs of the 128 DACs contribute to the overall DAC output that is then filtered in a following analog I/V stage 102 as described above; one of skill in the art will be able to select or design a circuit appropriate for I/V stage 102, as such circuits are well known in the art. Circuit 100 has a nominal gain defined, as above, by the ratio of $R_{fb}$ to $R_{dac}$, where again $R_{dac}$ is the DAC array output impedance and $R_{fb}$ is the feedback resistance in I/V stage 102.

FIG. 2 is a block diagram of a circuit 200 containing an array of 128 1-bit DACs according to one embodiment of the present approach. Again, the 128 DACs are shown as four groups of 32 DACs each. Again all of the outputs of the 128 DACs contribute to the overall DAC output that is then filtered in a following analog I/V stage 102 as described above.

However, in circuit 200, two of the groups of DACs, thus one-half or 64 of the 128 DACs in the array, are capable of entering the tri-state in which the DAC output resistors are not connected to either reference GND or VCC. When it is determined that the desired output signal is low enough that less gain is needed, the 64 DACs capable of the tri-state are placed in the tri-state, so that only 64 of the DACs are being driven between the analog references GND and VCC, and the other 64 are in the tri-state mode and not connected to either reference. The determination of whether less gain is needed, and whether and how many of DACs should be placed in the tri-state, will typically be made by a controller (not shown), which generates a control signal to the DACs that are to be placed in the tri-state.

In one embodiment the determination of whether less gain is required is performed using a peak detector; peak detection may be performed anywhere in the chain since the gain of all of the elements is known. The controller determines that there is sufficient headroom to turn down the analog gain by making sure that the input signal peaks are lower than the maximum output level by a certain amount, measured in decibels (dB); in some embodiments this number of decibels is programmable. For example, placing half of the DACs in the tri-state reduces the analog gain by 50%, or about 6 dB; thus, the controller looks to see if the input signal peaks are more than 6 dB lower than the maximum output level. In this case, the digital signal can be amplified by the same amount, i.e., 6 dB or a factor of two, without clipping.

One type of peak detector that may be used in such an embodiment is an envelope detector with instant attack and a slow decay; a base is set by first taking the absolute value of the input (so as to capture negative input values as well as positive ones). The peak detector tracks the peak values instantaneously to avoid clipping of the output signal, and then slowly decays the tracked value using a programmed time constant if the input signal is less than the absolute value of the previous peak input. Such envelope detecting as an indicator of signal strength is well known in the art, particularly with respect to radio frequencies. See, e.g., The Electronics Handbook, 2d ed., § 12.2, pp. 1368 et seq., CRC Press (2005).

When the envelope goes below a predetermined threshold, a predetermined number of the DACs are placed in the tri-state. This process occurs continuously; the result is that DRE occurs automatically when the input signal level is low enough for a long enough period of time. However, it may be seen that if, for example, the user sets the volume low enough that the peaks are always below the maximum output level by the programmed amount (in dB), DRE will always be activated.

Since the DAC array output impedance $R_{dac}$ is the output impedance of a single DAC divided by the number of DACs connected to the output, decreasing the number of 1-bit DACs, N, by one-half increases $R_{dac}$ by a factor of two when only 64 1-bit DACs are connected to the output rather than 128 1-bit DACs. Thus, since the outputs of the DACs in array 200 are connected to the external analog filter circuit 102 that has its gain determined by $R_{fb}/R_{dac}$ where $R_{fb}$ is a feedback resistance in the I/V stage as above, this would cause the nominal analog signal gain to decrease by a factor of two. Compensation for this reduction in analog gain is typically made by increasing digital gain before the DACs (by components not shown here) by the inverse of the reduction in analog gain; thus, in this example where analog gain is cut in half, the digital gain is doubled.

As above, DRE may be implemented by placing, for example, half of the DACs in the tri-state, which results in a reduction of analog gain of 50% or about 6 dB; as above, the digital gain is doubled to compensate and keep the overall circuit gain constant. One of skill in the art will appreciate that, as a practical matter, in such a case it is unwise to place the threshold for implementing DRE at the level when the input signal is also reduced by 6 dB, as the circuit will respond to a sudden increase in the input signal by immediately trying to reactivate (i.e., no longer being placed in the tri-state) the DACs. If all the DACs aren't reactivated, and the digital gain deactivated quickly enough, this will result in clipping of the digital signal and also the output signal.

To avoid this problem, in some embodiments the threshold for commencing DRE is set significantly lower; in one embodiment, the threshold is set at the point at which the input signal is down by 42 dB from full scale (−42 dBFS). Further, to avoid the DACs being placed in a tri-state at that input signal level and then reactivated immediately when the input signal increases even slightly, in some embodiments the threshold for reactivating DACs occurs at a level about 2 dB higher, i.e., the input signal level must increase by about 2 dB from where the DRE commenced before the DRE begins to turn off. If the level for commencing DRE is at −42 dBFS as above, the reduction in DRE would thus occur when the input signal has increased to about −40 dBFS. Further, the DACs need not be reactivated all at once, but may be phased in as the input signal increases again.

In some embodiments, a circuit may be implemented that sets the threshold levels of implementing and stopping DRE, and the decay rate of the envelope tracker. In other embodiments, the circuit may be implemented that allows an end user to set these parameters.

In addition to the reduction in the gain of the analog signal, there is a reduction in the amount of noise gain. In an ideal I/V stage, the noise gain is $1+R_{fb}/R_{dac}$. Suppose in a given instance that the gain given by $R_{fb}/R_{dac}$ is initially 2; the initial noise gain would be $1+R_{fb}/R_{dac}=1+2=3$. But if $R_{dac}$ doubles, causing the gain $R_{fb}/R_{dac}$ to drop by half to a gain of 1, then the new noise gain is reduced from 3 to 2. It will be appreciated that the noise gain does not drop by as much as the signal gain, but the reduction can be significant and results in DRE of the circuit.

One of skill in the art will appreciate that the number or portion of DACs placed in the tri-state need not be one-half, but may be any desired number or portion, and that selecting different numbers or portions of the DACs to place in the tri-state will alter both the analog signal gain and the noise gain. One of skill in the art will be able to configure a controller to select the number or portion of DACs to be placed in the tri-state based upon the amplitude of the analog signal that the DAC is trying to create. Again, when the analog gain is reduced, the digital gain should be increased to compensate so that the total gain remains constant at the desired amplitude.

A designer may choose to place any number of the DACs in the tri-state when the input signal is small enough as long as enough DACs remain active to create the output level as if there was no amplitude compensation between the analog and digital domains. Thus, in the example above, half of the DACs are placed in the tri-state and the digital gain is doubled. However, if there are 128 DACs as above, one could place 127 DACs in the tri-state and leave one DAC active, thus reducing the analog gain to ¹⁄₁₂₈ of the maximum output value, and compensate by increasing the digital gain by 128 times. In theory, if there is no input signal at all, one could place all of the DACs in the tri-state, which implies infinite digital gain and infinite attenuation in the analog domain.

Figure 3:
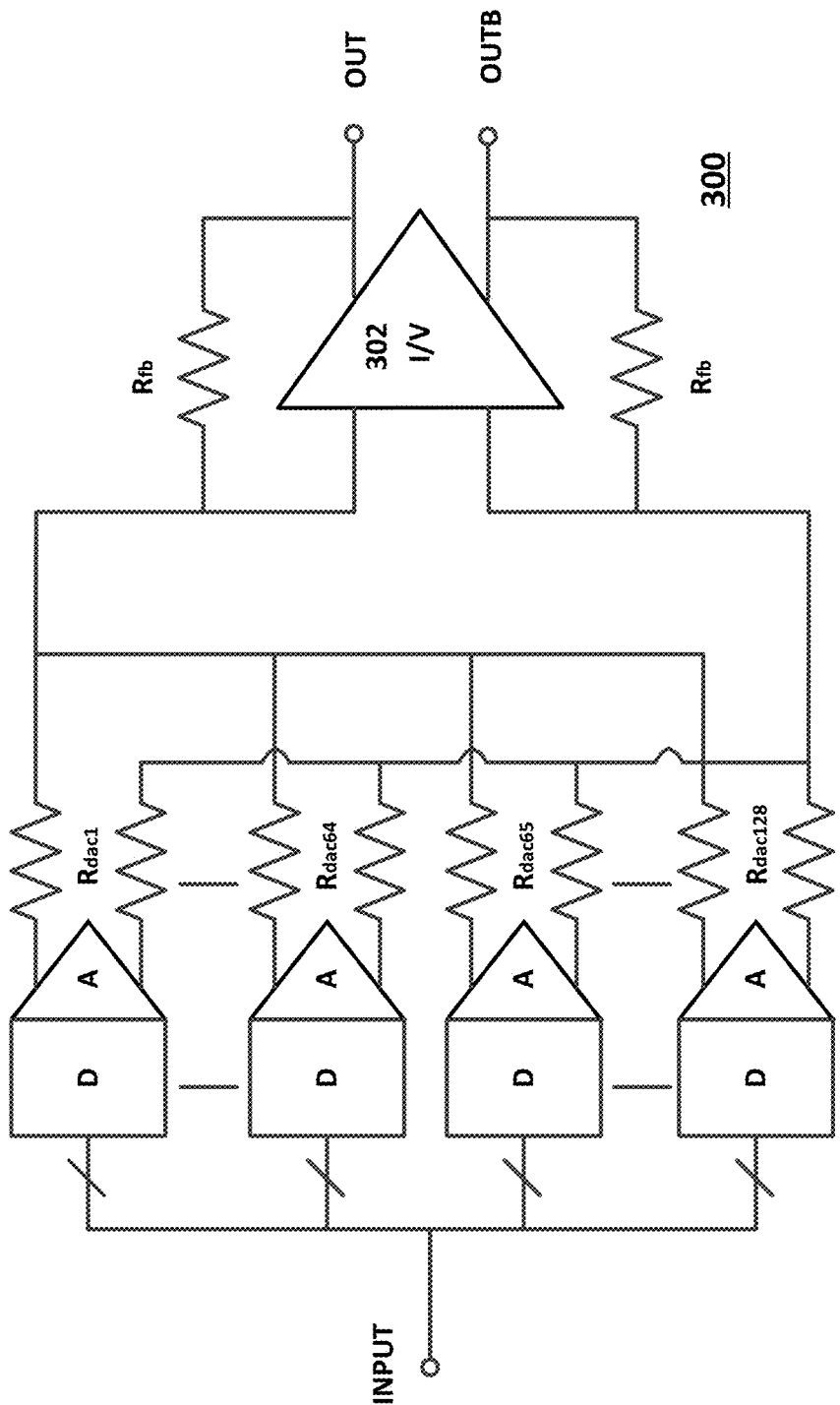
FIG. 3 is a circuit diagram of an array of 1-bit DACs as known in the prior art.

FIG. 3 is a circuit diagram of an array 300 of 128 1-bit DACs and an I/V stage as known in the prior art; it corresponds to the block diagram of circuit 100 in FIG. 1. The 128 DACs are again shown as four groups of 32 DACs each. Each DAC now shows two outputs, as each DAC can output a value of either GND or VCC as above. All of the outputs of the 128 DACs contribute through resistors to the overall DAC output that is then filtered in a following analog I/V stage 302 as described above.

The first 64 DACs are connected to I/V stage 302 through resistors $R_{dac1}$ to $R_{dac64}$ (each $R_{dac}$ is actually a pair of resistors, one connected to the positive output of the DAC and one connected to the negative output) and the other DACs are connected to I/V stage 302 through resistors $R_{dac65}$ to $R_{dac128}$. The feedback resistors $R_{fb}$ in I/V stage 302 are explicitly shown. All of the positive outputs of the DACs are connected to one input of I/V stage 302, and all of the negative outputs of the DACs are connected to the other input of I/V stage 302. I/V stage 302 also has two outputs, labeled as OUT and OUTB (or "out bar"); OUTB is the inverse of OUT, so that the analog output of I/V stage 302 is a differential analog signal. The positive and negative outputs are compliments of each other; this is not necessary for operation of the circuit but provides a differential output. If all the DACs have their positive output impedance elements connected to the GND reference, then the negative output impedance elements are connected to the VCC reference, and vice versa.

Figure 4:
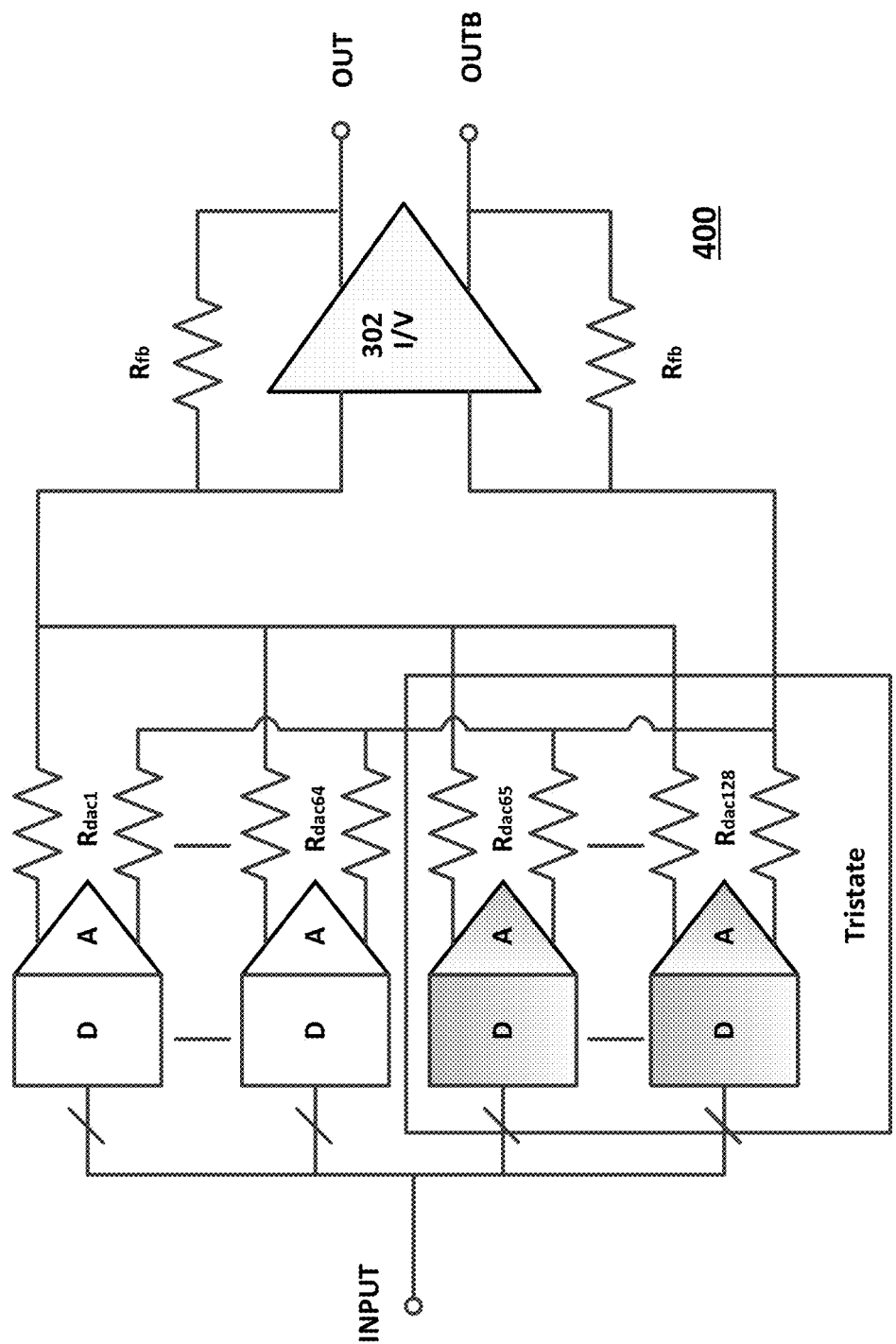
FIG. 4 is a diagram of an array of 1-bit DACs according to one embodiment of the present approach.

FIG. 4 is a circuit diagram of an array 400 of 128 1-bit DACs and an I/V stage according to one embodiment of the present approach; it corresponds to the block diagram of circuit 200 in FIG. 2. The components of array 400 are similar to those of array 300 of FIG. 3; 128 DACs are again shown as four groups of 32 DACs each. As in FIG. 3, each DAC now shows two outputs, as each DAC can output a value of either GND or VCC as above. As in FIG. 3, all of the outputs of the 128 DACs contribute through resistors to the overall DAC output that is then filtered in a following analog I/V stage 302 as described above.

However, although not explicitly shown, as in array 200 of FIG. 2, in array 400 two of the groups of DACs, thus one-half or 64 of the 128 DACs in the array, are again capable of entering the tri-state. When it is determined that the desired output signal is low enough that less gain is needed, the 64 DACs capable of the tri-state are placed in the tri-state, so that only 64 of the DACs are being driven between the analog references GND and VCC, and the other 64 are in the tri-state mode and not connected to either reference. As described above, this reduces both the analog signal gain and the noise gain of I/V stage 302; the digital gain is increased in an amount that keeps the overall gain of the circuit constant, and the decrease in noise gain results in DRE for the overall circuit.

Figure 5:
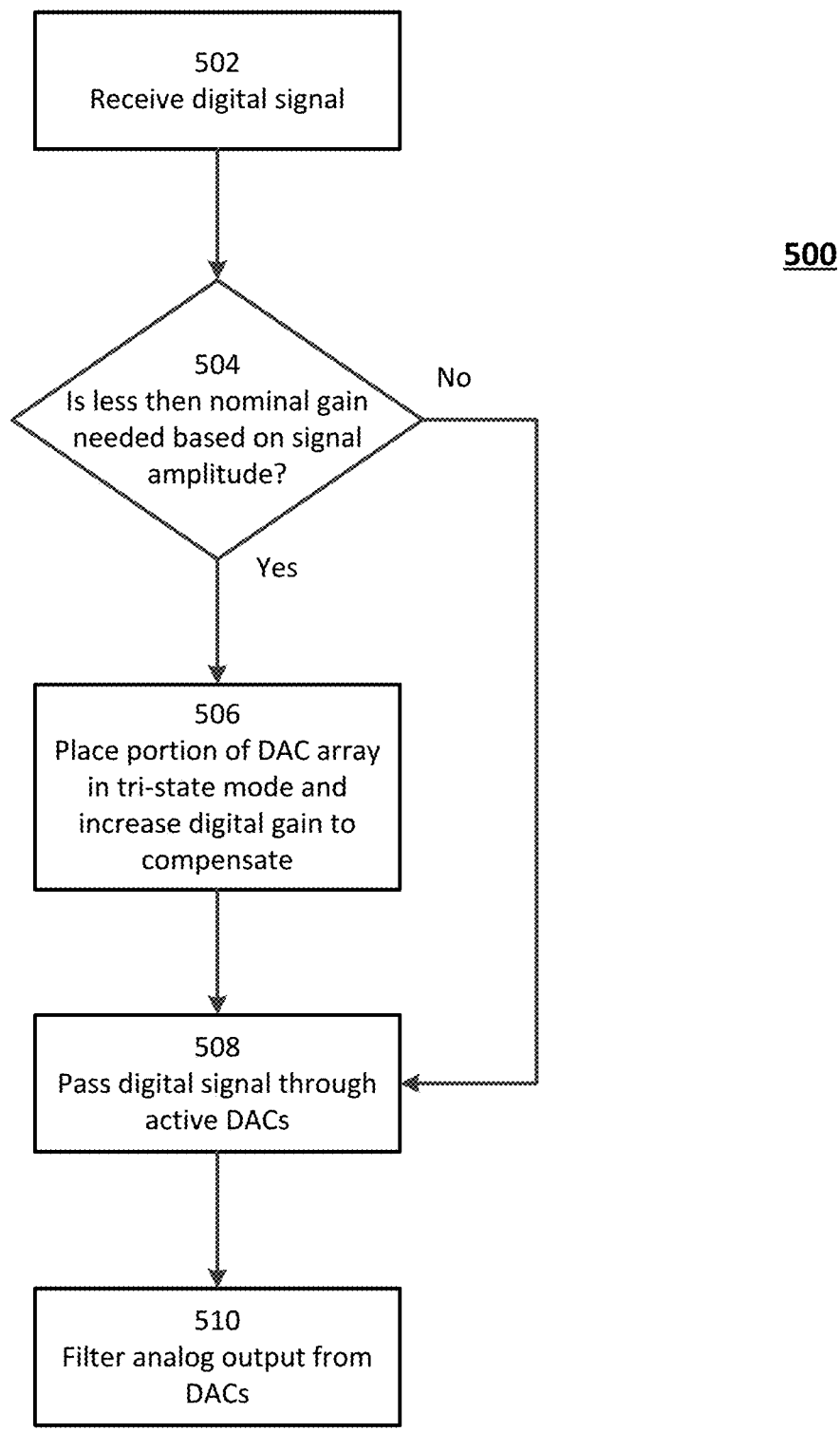
FIG. 5 is a flow chart of a method of operating a digital-to-analog converter according to one embodiment of the present approach.

FIG. 5 is a flow chart of a method 500 of operating a digital-to-analog converter according to one embodiment of the present approach.

At step 502, a circuit containing an array of DACs, such as circuit 400 of FIG. 4 above, receives a digital signal.

At step 504, a determination is made of whether the nominal gain of the analog circuit, i.e., the gain when all DACs contribute their peak output positive and negative signals, is needed due to a desired analog signal amplitude. For example, as above, turning down the volume of an audio signal playback may result in requirement of less than the peak output of the circuit.

If the determination made in step 504 is that the nominal gain is not required, at step 506 a portion of the DACs in the array is placed in a tri-state mode, again a third state in which the output of DACs in the tri-state mode are not connected to either the GND level or the VCC level. Again, any portion of the array may be placed in a tri-state mode; one of skill in the art will be able to determine what portion of the DAC array should be placed in the tri-state mode to achieve a desired result based upon the desired level of the analog signal. The digital gain, i.e., gain before the DACs, is increased to compensate for the decrease in analog gain that is caused by decreasing the DAC array output impedance in order to keep the overall gain of the circuit constant. The process then proceeds to step 508.

Alternatively, if the determination made in step 504 is that the nominal gain is required, none of the DACs are placed in the tri-state mode and the digital gain is not increased, and the process proceeds to step 508.

At step 508, the digital signal is passed through the DACs that are active, i.e., those that are not in the tri-state mode. If some of the DACs have been placed in the tri-state mode in step 506, then the digital signal is only passed through the remaining DACs, i.e., the ones that have not been placed in the tri-state mode. If none of the DACs have been placed in the tri-state mode, then all of the DACs are active and the digital signal is passed through all of the DACs in the array.

At step 510, the analog output from the DACs is filtered as above to remove quantization noise and provide gain of the analog signal.

It will be apparent that some of the described steps can occur essentially simultaneously, and thus it is not necessary to perform the listed steps in the precise order. Placing a portion of an array of DACs in a tri-state mode in order to reduce analog gain and noise gain is all that is necessary to fall within the current approach.

By combining these features, it is possible to construct a circuit that performs digital-to-analog conversion with dynamic range enhancement. One of skill in the art will appreciate that a circuit of any desired resolution, i.e., the number of bits of the digital signal and thus the number of DACs in an array, may be constructed according to these principles.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art. Further, the illustration of transistors and the associated feedback loops, resistors, etc., is exemplary; one of skill in the art will be able to select an appropriate number of transistors and related elements for a particular application.

These and other variations upon the embodiments are intended to be covered by the present disclosure, which is limited only by the appended claims.

What is claimed is:

1. An apparatus comprising:
   a first plurality of digital-to-analog converters (DACs), each DAC in the first plurality of DACs configured to receive a digital signal and to produce outputs at two reference levels;
   a second plurality of DACs, each DAC in the second plurality of DACs configured to receive the digital signal and to have two states to produce outputs at two reference levels and a third state to produce no output;
   an analog following circuit configured to receive outputs from the first and second plurality of DACs and to amplify and filter the outputs from the first and second plurality of DACs thereby producing an analog signal;
   a controller configured to determine that the amplitude of the analog signal does not require outputs from all of the first and second plurality of DACs and to generate a control signal to the second plurality of DACs to enter the third state to produce no outputs.

2. The circuit of claim 1 wherein the first and second plurality of DACs are 1-bit DACs.

3. The circuit of claim 1, further comprising:
   a digital gain element configured to receive and amplify the digital signal and wherein the first and second plurality of DACs are configured to receive the amplified digital signal instead of the digital signal; and
   wherein the controller is further configured to generate a second control signal to cause the gain of the digital amplifier to increase when the second plurality of DACs has entered the third state and produces no outputs.

4. The circuit of claim 1 wherein the controller comprises an envelope tracker and is configured to determine that the amplitude of the analog signal does not require outputs from all of the first and second plurality of DACs and is configured to generate the control signal when the analog signal has been below a threshold for a predetermined period of time.

5. An apparatus comprising:
a first plurality of digital-to-analog converters (DACs), each DAC in the first plurality of DACs configured to receive a digital signal and to produce outputs at two reference levels;
a second plurality of DACs, each DAC in the second plurality of DACs configured to receive the digital signal and to have two states to produce outputs at two reference levels;
an analog following circuit configured to receive outputs from the first and second plurality of DACs and to amplify and filter the outputs from the first and second plurality of DACs thereby producing an analog signal;
a plurality of switches, each switch coupled to a different one of the second plurality of DACs and having two positions, a first position which passes the output of the DAC to which it is coupled to the analog following circuit and a second position which prevents the output of the DAC to which it is connected from being passed to the analog following circuit; and
a controller configured to determine that the amplitude of the analog signal does not require outputs from all of the first and second plurality of DACs and to generate a control signal to the plurality of switches to place the switches in the second position so that no outputs from the second plurality of DACs are passed to the analog following circuit.

6. The circuit of claim 5 wherein the first and second plurality of DACs are 1-bit DACs.

7. The circuit of claim 5, further comprising:
a digital gain element configured to receive and amplify the digital signal and wherein the first and second plurality of DACs are configured to receive the amplified digital signal instead of the digital signal; and
wherein the controller is further configured to generate a second control signal to cause the gain of the digital amplifier to increase when the second plurality of DACs has entered the third state and produces no outputs.

8. The circuit of claim 5 wherein the controller comprises an envelope tracker and is configured to determine that the amplitude of the analog signal does not require outputs from all of the first and second plurality of DACs and is configured to generate the control signal when the analog signal has been below a threshold for a predetermined period of time.

9. A method of generating an analog signal from a digital-to-analog circuit comprising first and second pluralities of digital-to-analog converters (DACs), each DAC in the first plurality of DACs configured to receive a digital signal and to produce outputs at two reference levels, and each DAC in the second plurality configured to receive the digital signal and to have two states to produce outputs at two reference levels and a third state to produce no output, and an analog following circuit configured to receive outputs from the first and second plurality of DACs and to amplify and filter the outputs from the first and second plurality of DACs, the method comprising:
receiving, by the pluralities of DACs, the digital signal;
determining, by a controller, when the analog signal does not require outputs from all of the DACs;
when the analog signal does not require outputs from all of the DACs, generating, by the controller, a control signal to the second plurality of DACs to enter the third state and produce no outputs and increasing gain of the digital signal before receipt of the digital signal by the first and second plurality of DACs; and
amplifying and filtering the outputs from the DACs to generate the analog signal.

10. The method of claim 9 wherein the first and second plurality of DACs are 1-bit DACs.

11. The method of claim 9, further comprising:
amplifying the digital signal and wherein the first and second plurality of DACs are configured to receive the amplified digital signal instead of the digital signal; and
generating a second control signal to cause the amount by which the digital signal is amplified to increase when the second plurality of DACs has entered the third state and produces no outputs.

12. The method of claim 9 wherein determining that the analog signal does not require outputs from all of the DACs and generating the control signal further comprises tracking the envelope of the analog signal and generating the control signal when the analog signal has been below a threshold for a predetermined period of time.

\* \* \* \* \*